US012588166B2

(12) United States Patent
Prunnila et al.

(10) Patent No.: US 12,588,166 B2
(45) Date of Patent: Mar. 24, 2026

(54) THERMALIZATION ARRANGEMENT AT CRYOGENIC TEMPERATURES

(71) Applicant: Teknologian tutkimuskeskus VTT Oy, Espoo (FI)

(72) Inventors: Mika Prunnila, VTT (FI); Alberto Ronzani, VTT (FI); Emma Mykkänen, VTT (FI); Antti Kemppinen, VTT (FI); Janne Lehtinen, VTT (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 131 days.

(21) Appl. No.: 18/470,777

(22) Filed: Sep. 20, 2023

(65) Prior Publication Data

US 2024/0015936 A1     Jan. 11, 2024

Related U.S. Application Data

(63) Continuation of application No. 17/676,581, filed on Feb. 21, 2022, now Pat. No. 11,800,689.

(30) Foreign Application Priority Data

Feb. 23, 2021     (FI) ...................................... 20215201

(51) Int. Cl.
*H05K 7/20*          (2006.01)
*F25D 19/00*          (2006.01)
(Continued)

(52) U.S. Cl.
CPC ....... *H05K 7/20509* (2013.01); *F25D 19/006* (2013.01); *F28F 21/08* (2013.01);
(Continued)

(58) Field of Classification Search
CPC ........... H05K 7/20372; H05K 7/20481; H05K 7/20509; H01L 23/3738; F28F 2013/006; F25D 19/006; H10N 60/10
See application file for complete search history.

(56) References Cited

U.S. PATENT DOCUMENTS 8,178,153 B2      5/2012  Feger et al.
11,004,763 B2      5/2021  Hathaway et al.
(Continued)

FOREIGN PATENT DOCUMENTS

JP        2016-040799 A      3/2016
JP        2017-088806 A      5/2017
WO        2013/047253 A1      4/2013

OTHER PUBLICATIONS

European Search Opinion for EP 24168258 dated Jul. 17, 2024.*
(Continued)

*Primary Examiner* — Zachary Pape
(74) *Attorney, Agent, or Firm* — Meunier Carlin & Curfman LLC

(57)          ABSTRACT

A thermalization arrangement at cryogenic temperatures is dislcosed. The arrangement comprises a dielectric substrate layer on which substrate a device/s or component/s are positionable, and a heat sink component is attached on another side of the substrate. The arrangement further comprises a conductive layer between the substrate layer and the heat sink component. A joint between the substrate layer and the conductive layer has minimal phonon thermal boundary resistance. Energy of conductive layer phonons are arranged to be absorbed by electrons. Another joint between the conductive layer and the heat sink component is electrically conductive. The substrate layer and the conductive layer have similar acoustic properties.

17 Claims, 4 Drawing Sheets

(51) Int. Cl.

| | |
|---|---|
| *F28D 19/00* | (2006.01) |
| *F28F 13/00* | (2006.01) |
| *F28F 21/08* | (2006.01) |
| *H01L 23/373* | (2006.01) |
| *H10N 60/10* | (2023.01) |

(52) U.S. Cl.
CPC ..... *H01L 23/3738* (2013.01); *H05K 7/20372* (2013.01); *H05K 7/20481* (2013.01); *H10N 60/10* (2023.02); *F28F 2013/006* (2013.01)

(56)　　　　　References Cited

U.S. PATENT DOCUMENTS

| | | | | |
|---|---|---|---|---|
| 11,800,689 | B2 * | 10/2023 | Prunnila | ............ H05K 7/20481 |
| 2005/0150539 | A1 | 7/2005 | Ghoshal et al. | |
| 2013/0258595 | A1 | 10/2013 | Tuckerman | |
| 2015/0065349 | A1 | 3/2015 | Yamazaki | |
| 2015/0362265 | A1 | 12/2015 | Broido et al. | |
| 2018/0102470 | A1 | 4/2018 | Das et al. | |
| 2020/0028062 | A1 | 1/2020 | Rosen et al. | |

OTHER PUBLICATIONS

European Search Report for EP 24168258 dated Jul. 17, 2024.*

Finnish Search Report dated Oct. 26, 2021, in Patent Application No. 20215201, 2 pages.

Brunbauer, F.M. et al., "Electrical transport properties of single-crystal Al nanowires", Nanotechnology, Aug. 17, 2016, vol. 27, Art. 385704.

Mykkänen, Emma et al., "Thermionic junction devices utilizing phonon blocking", Sciences Advances, Apr. 10, 2020, 9 pages.

Mykkänen, Emma et al., "Phonon-blocked junction refrigerators for cryogenic quantum devices", International Electron Devices Meeting, 4 pages.

Little, W.A., The Transport of Heat Between Dissimilar Solids at Low Temperatures, Canadian Journal of Physics, Mar. 1959, vol. 37, pp. 334-349.

Swartz, E. T. and Pohl, R. O., Thermal Boundary Resistance, Reviews of Modern Physics, Jul. 1989, vol. 61 Issue 3, pp. 605-668.

Written Opinion of the International Searching Authority for PCT/FI2022/050109, 2022.

Office Action mailed Feb. 3, 2026 in corresponding JP application 2023-543417 with english translation.

\* cited by examiner

THERMALIZATION ARRANGEMENT AT CRYOGENIC TEMPERATURES

CROSS REFERENCES

This is continuation application of U.S. non provisional application Ser. No. 17/676,581 file don Feb. 21, 2022 and claiming priority to Finnish national application FI20215201 filed on Feb. 23, 2021.

FIELD OF TECHNOLOGY

The invention relates to a thermalization arrangements at cryogenic temperatures. Especially, the invention relates to in-chip arrangements.

PRIOR ART

Cryogenic temperatures may be defined to mean temperatures ranging from 93 K (kelvin) to zero K (absolute zero), but also different values are used. In general, cryogenics refers to technology for achieving very low temperatures in order to study behavior of materials and phenomenon at very low temperatures and to create proper operating conditions for different cryogenic devices.

Cryogenic devices are delicate sensors and other devices. In comparison to room temperature, cryogenic temperatures bring in significant reduction of thermal noise, thereby improving resolution and sensitivity of sensors and other devices, for example, cold image sensors for high-performance thermal imaging (like night vision, body heat analysis, astronomy, devices in medicine etc.), cooled IR sensors, and photon detectors. More importantly, it enables utilization of physical effects with small energy scales, such as superconductivity and quantum confinement in solid-state and many other quantum phenomena. These effects can be utilized, for example, in quantum computing, communication, and sensing.

FIG. 1 shows a typical prior art situation. The cryogenic devices or their components 1 are attached on a substrate 2, which is dielectric material at operating temperature. At cryogenic temperatures phonons in the substrate have long mean free path. The phonons do not scatter much with-in the length scale of the mean free path. The other side of substrate is attached to an electrically conducting heat sink layer 4, like a metal layer or a solid state cooling element.

The interface between the cooling layer and the substrate, or between a connection layer 3 (like adhesive in the example of FIG. 1) and the substrate typically forms a reflection surface for the phonons in the substrate, because there is a mismatch, called as acoustic mismatch, between said materials. Therefore, a phonon transmitting energy from the device/component on the surface of the substrate may reflect back into the substrate from said interface and substrate (top) surface even multiple times. The reflected phonon may disturb the devices and components on the surface of the substrate. Therefore, the cooling/thermalization is not very effective.

SHORT DESCRIPTION

The object of the invention is to alleviate the problem said above. The object is achieved in the way described in the independent claim. Dependent claims illustrate different embodiments of the invention.

An inventive embodiment comprises a thermalization arrangement at cryogenic temperatures, which arrangement comprises a dielectric substrate 2 layer on which substrate a device/s or component/s 1 are positionable. A heat sink component 4 is attached on another side of the substrate. The arrangement further comprises a conductive layer 5 between the substrate layer 2 and the heat sink component 4. A joint between the substrate layer 2 and the conductive layer 5 has minimal thermal boundary resistance. Inside the conductive layer phonons are absorbed by electrons. Another joint between the conductive layer 5 and the heat sink layer 4 is electrically conductive which thermalizes the electrons of layer 5 efficiently to the heat sink layer 4.

The invention improves the cooling or thermalization of the device/s or component/s on the surface of the substrate by eliminating the reflections of phonons in the substrate and by making it possible to absorb the energy of the phonons by the electrons in the conductive layer. So, the thermal energy is changed to be carried by the electrons in the conductive layer 5. The thermal energy in the electrons can be efficiently transported through the other conductive joint to the heat sink component 4.

LIST OF FIGURES

In the following, the invention is described in more detail by reference to the enclosed drawings, where FIG. 1 illustrates an example of a prior art thermalization arrangement, FIG. 2 illustrates an example of an inventive thermalization arrangement, FIG. 3 illustrates another example of an inventive thermalization arrangement, and FIG. 4 illustrates yet another example of an inventive thermalization arrangement.

DESCRIPTION OF THE INVENTION

Figure 1:
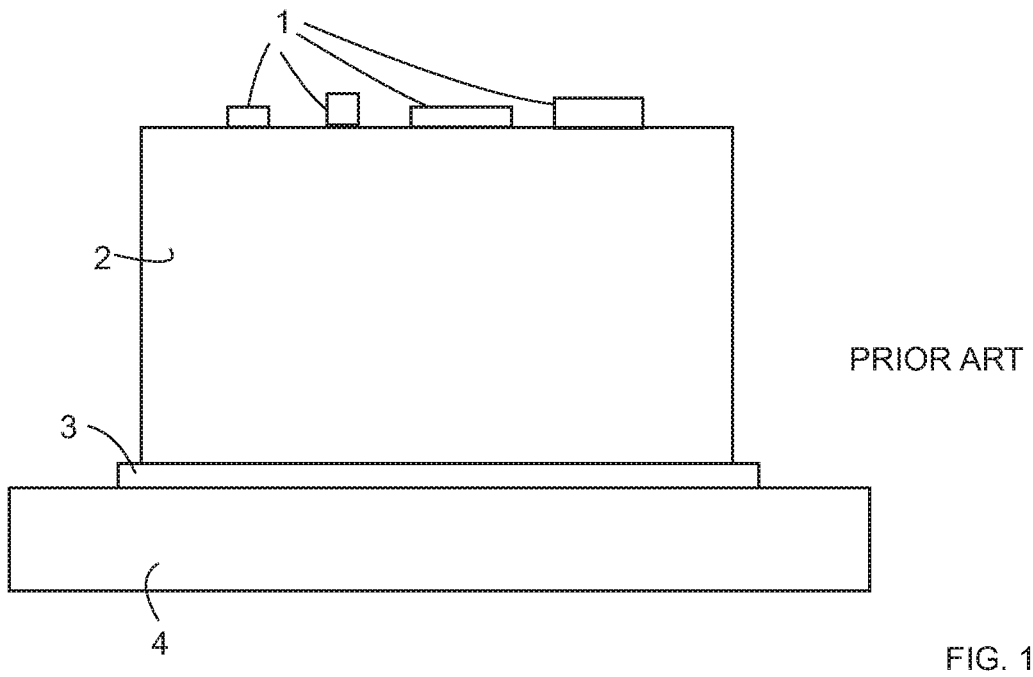
Figure 2:
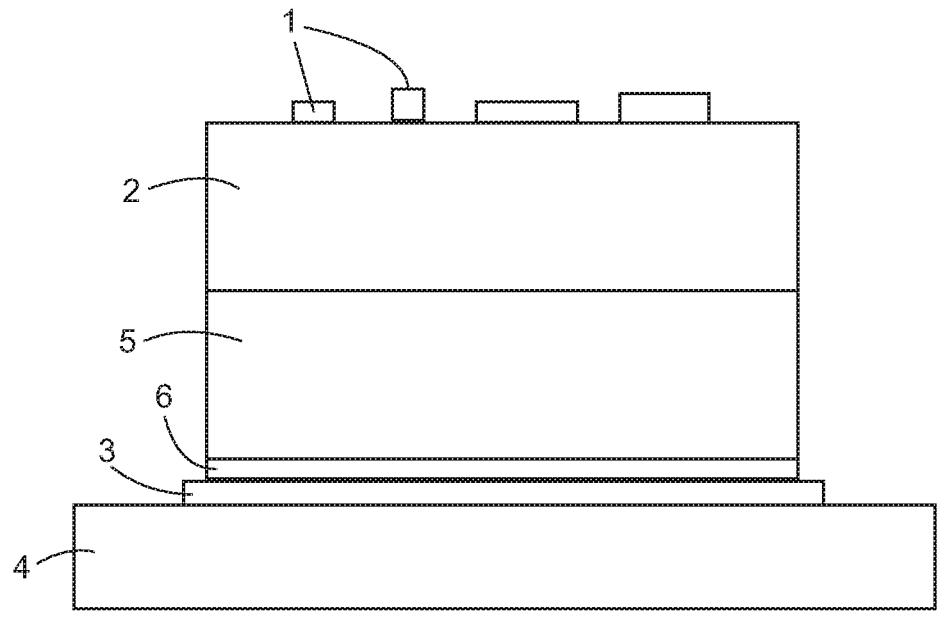

FIG. 2 illustrates an example of an inventive thermalization arrangement at cryogenic temperatures. The devices or their components 1 to be cooled/thermalized are on a substrate. The device or devices are electrical devices, like sensors or quantum components, such as qubits, etc. The component or components are electrical components like resistors, capacitors, inductors, tunnel junctions, superconducting components etc. More precisely, the substrate is dielectric substrate 2 layer on which substrate a device/s or component/s 1 have been fabricated or are attached on, for example, using flip-chip technique.

The substrate is, for example, silicon-based material having normally thickness ranging from 200 μm to 1 mm. For example, silicon, silicon-oxide, silicon-nitride or their combination are materials used as a wafer (substrate). The used materials for the substrate are dielectric or semiconducting as non-degenerately doped semiconductors become dielectrics at sufficiently low temperature.

A heat sink layer 4 is attached on another side of the substrate. The arrangement further comprises a conductive layer 5 between the substrate layer 2 and the heat sink component 4. A joint between the substrate layer 2 and the conductive layer 5 has minimal thermal boundary resistance. Inside the conductive layer phonons are arranged to be absorbed by electrons. Another joint between the conductive layer 5 and the heat sinking component 4 is electrically conductive. The heat sinking component can be, for example a metal plate, which is not in superconducting state, or a solid state cooler.

Figure 3:
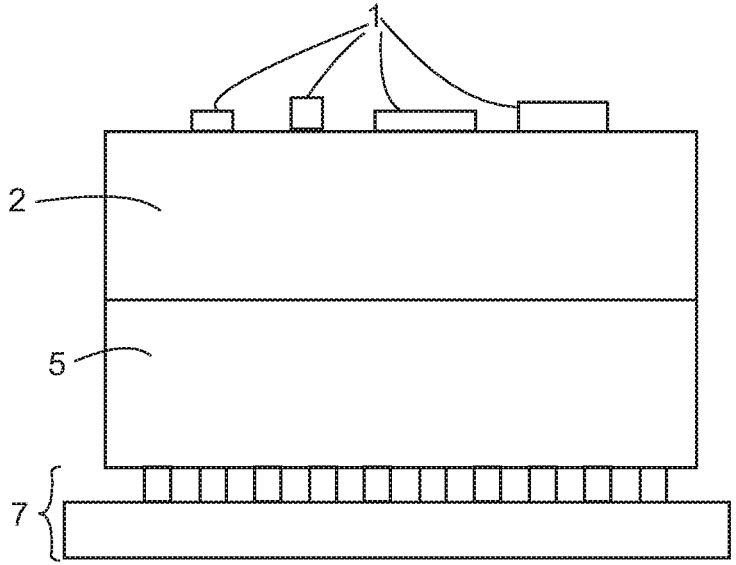
Figure 4:
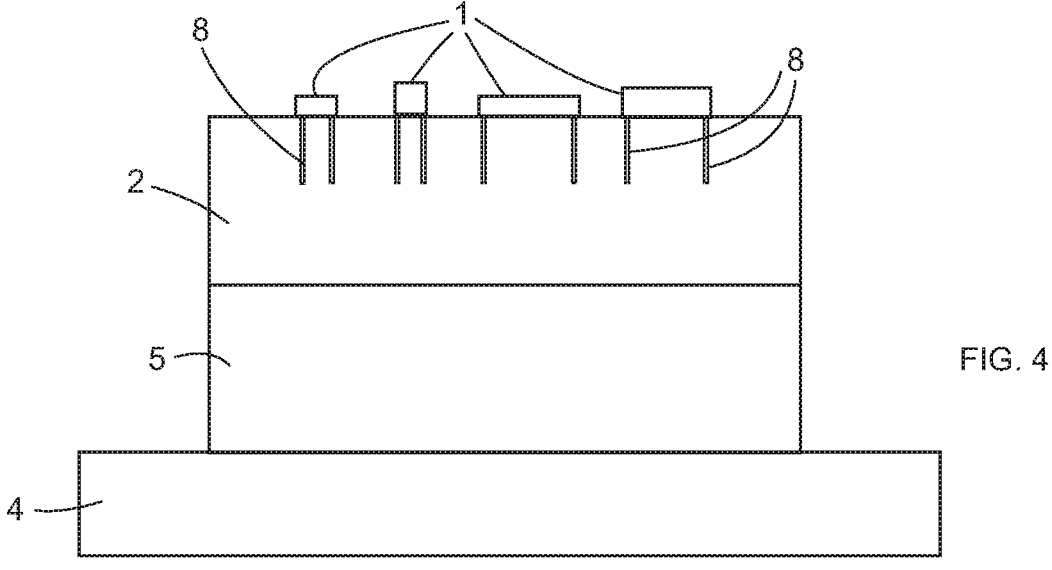

The other joint between the conductive layer 5 and the heat sinking component 4, 7 can be direct like in FIGS. 3 and 4, but it can also be formed by using an additional layer, which is electrically conductive, but not in a superconducting in state. For example, the attachment between the heat sink 4 and the conductive layer 5 can comprise an electrically conductive adhesive. Further, the attachment may have further layers. For example, the attachment between the heat sink component 4 and the conductive layer 5 can further comprise a metal layer 6 between conductive layer and the electrically conductive adhesive. This embodiment is in the embodiment of FIG. 2.

The invention improves the cooling or thermalization of the device/s or component/s on the surface of the substrate by eliminating the reflections of phonons in the substrate and by making it possible to absorb phonons by the electrons on the conductive layer.

The substrate layer 2 is dielectric material at cryogenic temperatures. So, the substrate layer reduces parasitic capacitance, dielectric losses etc. in relation to the devices or components on the surface of the substrate. The substrate layer is, for example, high purity silicon, semiconductor (dielectric at cryogenic temperatures) or the like. The high purity silicon is purified silicon without purposefully added dopants species. Therefore, the substrate layer matches with the requirements of the application, (devices or components).

The phonons are excited in the substrate layer due to hot electrons in the devices or components on the surface. The phonons are the quanta of the lattice vibrations. Because of the very long mean free path of the phonons, they can transport the thermal energy without difficulties to the joint/attachment between the substrate layer 2 and the conductive layer 5.

The joint/attachment between the substrate layer 2 and the conductive layer 5 has been made so that there is a high acoustic match, which means that the phonons go through the joint/attachment, with high probability, so not reflecting back. In other words this means that there is minimal phonon thermal boundary resistance between the substrate layer 2 and the conductive layer 5, e.g., the phonon thermal boundary resistance is below $R_{Bd}=10$ K$^4$/(W/cm$^2$)/T$^3$, where T is the phonon temperature in layer 2. This can be achieved, for example, using high purity single crystalline silicon as the substrate layer, and single crystalline degenerated doped silicon as the conductive layer 5, which enables good lattice match and similar properties for phonon propagation in both sides. The joint/attachment is a high-quality joint, which means that atomic mismatch should minimal between the materials.

As said the conductive layer 5 has been made from degenerately doped silicon or conductor that has acoustic properties similar to layer 2. The phonons passing through the joint/attachment interface are absorbed by the conductive layer 5. Due to the degenerate doping the conductive layer has free carriers (electrons or holes). The conductive layer smoothly changes the phonon heat into heat of electrons that is efficiently transferred to layer 4 by electron transport.

From top-to-bottom propagating phonons smoothly release their energy to the free carriers. Practical doping range for silicon operated at low temperatures is around 5E18 cm$^{-3}$ and above. The bottom of the conductive layer 5, i.e. the part near the heat sinking component 4 may have even higher doping (for silicon in the range 1-10E20 cm$^{-3}$), so that it can be contacted reliably by a metal. Ultra high doping of the bottom part assures that the Schottky barrier does not hinder the movement of the charge carriers and the related heat transport.

The heat sinking component 4, like a metal layer, is connected to the other side of the conductive layer 5 mounting by a conductive glue or other means. As said the mounting can also be direct. The connection between the conductive layer 5 and the heat sinking component is as low electrically resistive as possible. This can be achieved, e.g., by conductive epoxies or the like.

Figure 9:
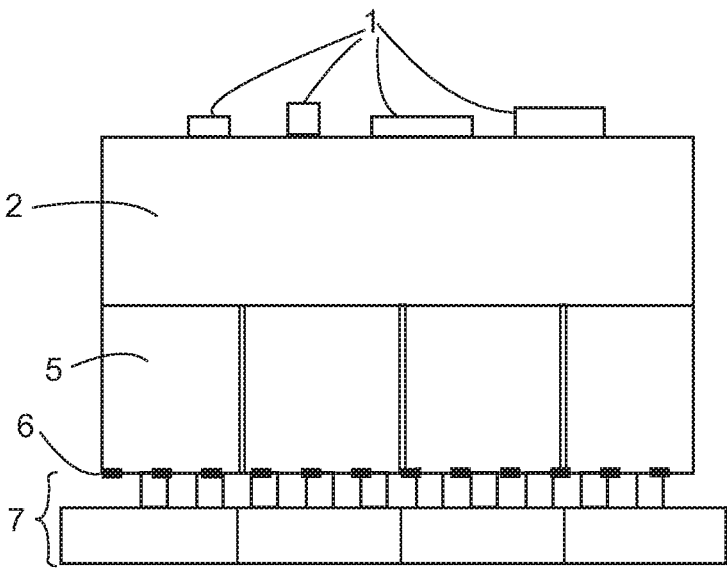
FIG. 9 illustrates yet another example of an inventive arrangement.

The heat sinking component 4 can also be exchanged by solid-state cooler 7 as illustrated in FIG. 3. The electrons or holes of the conductive layer 5 are cooled by active cooling. This solid-state cooler can also be formed so that it actually comprises more than one cooler, by utilizing daisy chained coolers. In this case the conductive layer 5 can be divided to two or more galvanically isolated regions. See FIG. 9. Between the layer 5 and the solid-state cooler 7 can optionally be bea conducting layer (metal) 6, as illustrated by a dashed line in FIG. 9.

For example, a micrometer-scale NIS cooler can be used as the solid-state cooler 7. It is based on a structure of normal metal N (non-superconducting, layer 5), insulator I (interface between 5 and 7) and superconductor S (layer 7). The hot electrons are filtered with the superconducting gap from the normal metal to the superconductor, i.e., normal metal electrons will be colder than the substrate phonons. Using the inventive arrangement, the cold electrons are thermalized with the phonons of the lattice in the substrate. Another type of a micrometer-scale solid state coolers are semiconductor-insulator-superconductor or semiconductor-superconductor (Sm-S) cooler having the same operation principle than the NIS cooler.

The daisy chained current bias scheme, enables more fault tolerant operation with better junction parameter spread tolerance. The daisy chained cooler may comprise of a long chain of NIS-type coolers (the micrometer-scale solid-state coolers) ranging from tens of individual coolers up to tens of thousands. Each individual cooler requires a galvanically separated thermalization volume in layer 5.

So, the solid-state cooler may comprise of one or more daisy chains of two or more of solid-state coolers that each are electrically current biased in a way that an average voltage drop over each cooler provides optimal total cooling for the complete cooler assembly. The different coolers in the cooler chain are used to cool different galvanically isolated conductive areas of the conductive layer (5).

FIG. 4 shows a further embodiment of the inventive thermalization arrangement. In this embodiment, the substrate layer 2 comprises a micrometer-scale conductor projection 8 in the dielectric substrate forming galvanically isolated electron-phonon thermalization point below 5 kelvin temperatures to a node of said device or component 1. FIGS. 5-8 show different embodiments of the projections 8, 8A, 8B in more detail.

At very low temperatures, thermalization of the electrons utilizing electron-phonon coupling is very challenging due to diminishing coupling between them. Typically the thermal energy exchange P between electrons and phonons follows $P=\Sigma V(T_e{}^n-T_p{}^n)$, where $T_e$ is the temperature of electron system (like that in the resistor 2), $T_p$ the temperature of the phonon system (like that in the substrate 1 and resistor 2), V the interaction volume (e.g. volume of the resistor) and $\Sigma$ is a material dependent electron-phonon coupling coefficient. Power n depends on the microscopic details of the electron-phonon interaction (for example in metals one often finds n~5). This means that when working at very low temperature, the said thermal energy exchange is very weak even in case when the temperature difference between the phonons and the electrons would be on relative scale large.

A cryogenic device may be refrigerated very near to the absolute zero, like tens of mK, which means that the temperature of the substrate is at the refrigerated temperature. The refrigeration can be achieved by known devices and means, for example using $^3He/^4He$ dilution refrigeration. Yet the effective temperature for operation of microscale cryogenic devices is the temperature of electrons in the devices, which can be significantly higher. This is due to the fact that the devices always need to be connected to higher temperatures in order to be used meaningfully, for example, through signal lines, which causes heat flow to the cryogenic device, primarily coupling to the electrons. Also operation of the device can involve dissipation, which in case of electric device, is observed as increased electron temperature.

So, because the electrons in a component or device can be hotter than the temperature in the lattice (substrate) the performance of the devices is limited by it or in case of low threshold energy device, the operation is completely destroyed by this.

On the other hand, electrons can be colder than the temperature in the lattice. For example, in cryogenic coolers, such as micrometer-scale doped semiconductor or normal metal-superconductor coolers, where the electrons of the normal metal are cooled below the substrate phonon temperature. Because directly coupling the cooled electrons to a device, that is to be cooled, is typically not possible because it would be harmful or detrimental to the cooled device operation, the coupling between the cooler and the cooled device is through phonons. The electrons of the cooler are coupled to phonons and these cooled phonons need to be coupled to the electrons of the cooled device. This requires very large thermalization volume in order the cooling to be efficient, i.e., transferring the heat from electrons to phonons and from phonons to electrons.

Figure 5:
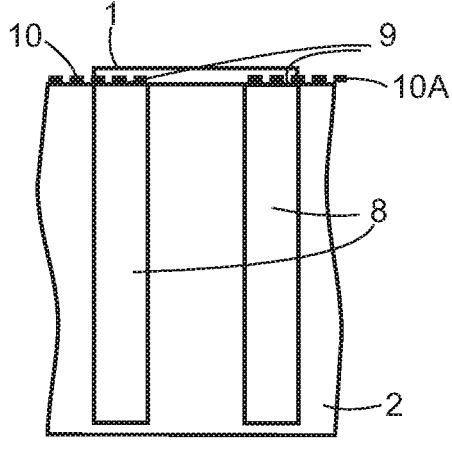
FIG. 5 illustrates details of the example of FIG. 4.

FIG. 5 shows an example of the projections 8. The arrangement of FIG. 5 shows the dielectric substrate 2 wherein a micrometer-scale conductor projection 8 has been formed to a node of an electric circuit. The micro-meter scale conductor projection is typically in direct galvanic contact to the node but in special cases it can be connected through near-field heat transport contact. The near-field heat transport means that the elements are separated only by very thin vacuum or dielectric barrier, i.e. non galvanic connection, but still enabling heat transfer exceeding the typical far-field blackbody limit. This arrangement forms galvanically isolated electron-phonon thermalization point to the node 9. The temperature is below 5 Kelvin, in which range the inventive arrangement has been found to work efficiently.

Figure 6:
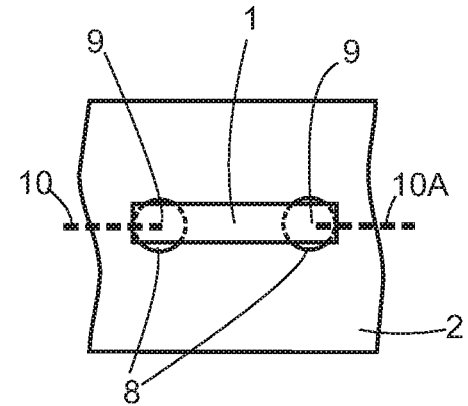
FIG. 6 illustrates the details of FIG. 5 from another angle.

As known, a node 9 is a point on a circuit where the terminals of two or more circuit elements meet. In FIGS. 5 and 6 electric lines 10, 10A are illustrated as bold dashed lines, which lines are connected for example to a voltage source or a current source (not shown in the figures). The connections of the component, like the resistor 1 and the lines 10, 10A provide the nodes 9 in this simple example. It is characteristic that a node has a node specific voltage level, when the electric circuit is turned on.

FIG. 5 is a very simple example having on electric component 1, like the resistor, having two nodes on the surface. It is clear the electric circuit on the substrate can be much more complicated and therefore comprising a number of nodes. The micrometer-scale conductor projection 8 is a node specific. So, the example of FIG. 5 has two conductor projections. In order that the electric circuit works properly, the conductor projection 8 is typically galvanically connected to the node but otherwise it is galvanically isolated. In other words, the conductor projection is galvanically isolated from the substrate. The arrangement makes it possible that thermalization between the electrons in the node and the phonons in the substrate can be enhanced.

FIG. 6 shows the example of FIG. 3 from above. A further benefit of using the projections becomes clear when comparing them with known on-chip metallic thermalization/cooler elements. These known elements are typically fabricated, for example, by plating through a mask or sputtering and etching metal islands on top of the device, its component or its leads. When the plating through a mask is used, the typical minimum distance between the neighbouring elements is of the order of the mask thickness. The mask thickness sets the maximum height of the plated structure. Typical values of modern fabrication are of the order mask thickness 10-50 μm, and the separation of neighbouring elements corresponds the thickness, i.e., 10-50 μm. If plating and wet etching is used, it limits the neighbouring element distance to at least twice the height of the film (the plating). Similar numbers are applicable for sputtered films, but the film thicknesses are also restricted by strain and other issues, such as long deposition time.

The invention has filled trenches in the substrate. The filling material is a conducting material as said above. The minimum separation between the elements is defined by the (thin) mask technology which can be sub-μm scale. The trench can be etched, for example, with Bosch etch process having a positive slope of 1-2 deg. Thus for 100 μm deep trench, opening of only 2 μm is required.

If to consider, for example, 10×10 μm2 surface area that has four galvanically isolated thermalization points. When using known solutions, this area would at maximum contain metallic volume assuming 1:1 fill ratio for metallic wires and 1:1 mask to metal ratio resulting in 4 cooling fins with height 3.33 μm, width 3.33 μm, length 3.33 μm giving total volume of 148 μm³. When using the inventive solution, four micrometre-scale thermalization with dimensions width 4.5 μm, length 4.5 μm, and depth 250 μm are reasonable to fabricate with current techniques using thin masks and high aspect ratio etching, such as Bosch process, yielding total thermalization volume of 10125 μm³. It is evident that any solution using the traditional surface mount approach cannot even come close to this volume.

In the example, the inventive solution has 250 μm deep projections with a spike shape. The larger volume inside the substrate means that the electron-phonon coupling is more effective between electrons in the projection and the phonons in the substrate. The distance between the neighbouring elements, i.e. nodes is smaller. Therefore, the invention enables high packing ratio of the thermalization pools/nodes on the surface of the substrate.

The strain can be a significant issue for thick deposited metallic films limiting use of many materials with the traditional techniques. By making the metallisation inside the substrate trenches, the surface strain accumulation is negligible. In addition, when thick metal layers are deposited on top of the substrate, those prevent or limit the potential fabrication steps following the deposition. Most of the fabrication methods can be only used for planar surfaces, i.e., for example stacking chips with flip chip technique. In case of filled trenches, the surface will be planar after thermalization pool fabrication.

The trenched structures are in direct contact with the substrate phonons of all possible modes in contrast to thin films on the substrate from which only one side is top of the substrate, which limits the thermalization. Also, the typical cooling fin solution is at least partially isolated from the substrate phonons because it is placed on top of the device which is to be thermalized. This may result in high phonon thermal resistance, caused by the multiple material interfaces between the fin and the substrate.

When the micrometre-scale thermalization arrangements are used in connection to the superconducting electrodes, they provide efficient means for quasiparticle relaxation, and related transfer of the energy of the non-equilibrium quasiparticles to the substrate phonons. The efficiency in this context means that, the phonons that are generated during the relaxation of the quasiparticles, can travel to any direction and are not likely to travel back to the superconductor in contrast to the case of the fin, which is placed on top of the superconducting electrode. The phonons generated in the fins are more likely to travel through the superconductor, before relaxing with phonons of the substrate, possibly causing detrimental effects.

Figure 7:
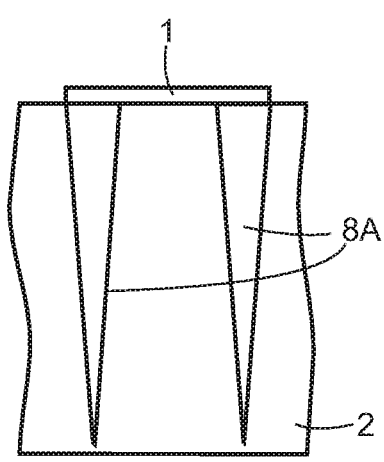
FIG. 7 illustrates another example of the details of FIG. 5.

The micrometer-scale conductor projection can have different shapes. In FIG. 5 the projection is a rod. Further, the rod may have different cross-sections like a circle (FIG. 6), a rectangular cross-section etc. FIG. 7 shows that the projection 8A is a spike. The spike may also have different cross-sections, like circle or rectangular. The tip of the spike (i.e. the bottom of the projection) can also be curved or flat. There are also other possible shapes for the conductor projection.

Figure 8:
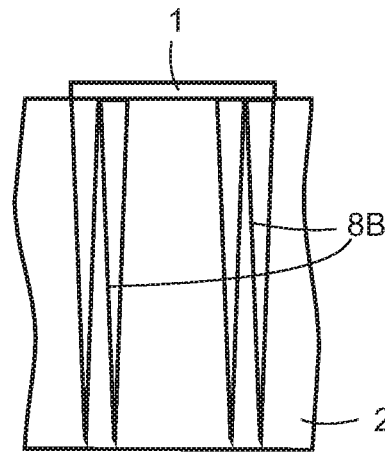
FIG. 8 illustrates yet another example of the details of FIG. 5.

FIGS. 5 and 6 show that only one conductor projection is for a single node. However, it also possible that inventive arrangement has several conductor projections per node. FIG. 8 illustrates an example of using two conductor projections 8B per node. However, the number of the conductor projections is not convenient to be very high, because then area used on the substrate for the filled trenches increases, which is not efficient. It has been found the good results for thermalization of a single node can be obtained when using 1-10 micrometer-scale conductor projections. These projections form together said galvanically isolated thermalization point.

The micrometer-scale conductor projection can have a width within range 1-100 μm. The length of the conductor projection is at least 5:1 ratio to the width of the conductor projection. It is worth to mention that conductor projection may extend through the substrate.

The micrometer-scale conductor projection is made of conducting material that is non-superconducting at the working temperature below 5 K. For example, tungsten-titanium, copper, gold, platinum, degenerately doped semiconductor or non-superconducting silicide alloy can be used. Materials that are superconducting below their critical temperature, but not superconducting at the working temperature of the component/device can also be used. For example, titanium and aluminium can be used at higher temperatures than their superconducting critical temperature 400 mK and 1.2 K, respectively.

Figure 10:
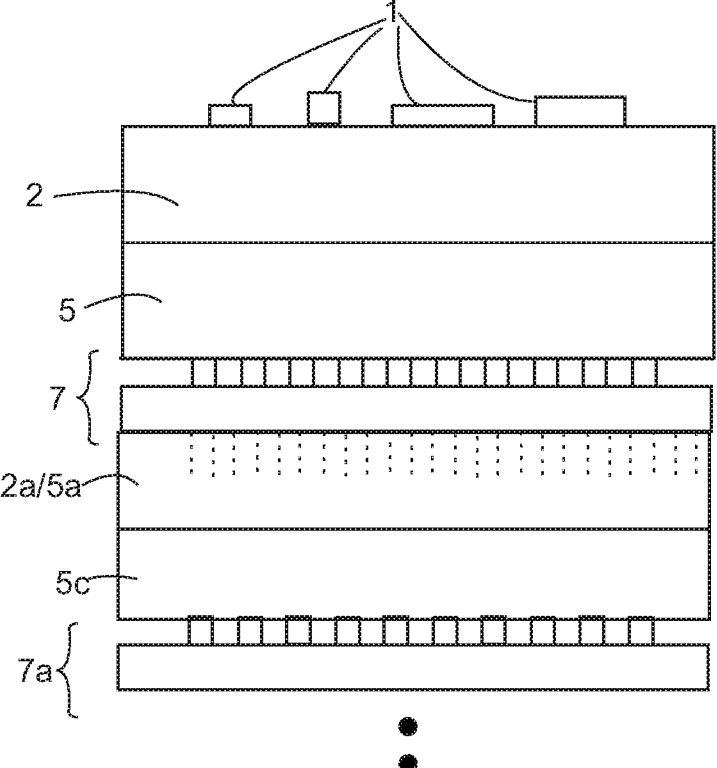
FIG. 10 illustrates yet another example of an inventive arrangement.

FIG. 10 illustrates a further embodiment of the invention. As can be seen in FIG. 10, the heat sink component may have a more complex structure as well. For example, the solid-state cooler 7 may be further connected to a further element layer 2a that has micro-meter-scale conductor projections, or a further conductive layer 5a being similar to the layer 5. After the further layer 2a, 5a there is another further layer 5c, which in turn is connected to another solid-state cooler 7a etc. So, a structure formed by said elements 2, 5 and 7 are arranged in series configuration in a way that the active cooling layer 7 of previous element is connected to the next layer 2, 5. In the case that the layer 2 is replaced by the layer 5, there is a thin dielectric between the subsequent layers 5. Such structure can be fabricated for example from SOI wafer that has both conducting handle and SOI layer.

Adiabatic nuclear refrigeration and more specially NDR (nuclear demagnetization refrigeration) can be used in conjunction with the micrometer-scale conductor projection by incorporating suitable materials in the projection such as copper. The NDR is based on magneto-thermodynamic phenomenon in which a temperature of a material is cooled by exposing the material to a changing magnetic field. The cooling power comes from the magnetic dipoles of the nucleus of the atoms in the material. When the process is adiabatic i.e. isolated, ambient heat energy is not allowed to heat the material during the process, the NDR cools the nuclei, i.e., phonons. By using the inventive micrometer-scale conductor projections in conjunction with the NDR cooling, also the electrons can be cooled to temperatures below 10 mK.

The projections can be manufactured by etching the trench or trenches on the substrate. For example, Bosch-etching or similar high-aspect ratio method can be used. The filling of the trenches with the suitable conducting material can be done with high coverage coating method such as LPCVD, ALD or chemical plating. Surface of the substrate can also be planarized by removing excess metal from surface.

Above there are already mentioned some benefits of the invention. The phonons do not reflect so easily in the substrate layer 2, but they propagate into the conductive layer 5 which absorb them and change their heat energy into heat energy of the free carriers (electrons). This is achieved by the fusion of the substrate layer and the conductive layer having an acoustic matching between them. The user can create the cooler (heat sink) component 4 (metal layer or the electric solid-state cooler) as a last step of device fabrication (alternatively the substrate vendor can provide also the metal layer). So, the thermal energy is changed to be carried by the electrons in the conductive layer 5. The thermal energy in the electrons can be conveniently transport through the other conductive joint to the heat sink component 4. Utilizing said projections at low temperatures, the required thermalization volume per device can be as high as 10000 $um^3$ in order to obtain reasonable efficiency in heat transfer between the electrons and the phonons. The total required volume in this case would be of the order few $10^5$ to $10^8$ $um^3$. This makes minimising the thermalization footprint the dominant factor of making a compact cooler. By the micron-scale conductor projections, the required area can be reduced by at least of a factor 100. So, using the galvanically isolated thermalization projection/s, a compact and efficient solid state cooler can be realized.

Concentric pool designs, i.e., having two or more concentric electrically conducting or superconducting layers separated with dielectric material which one needs to be normal state conductor, enables the thermalization functionality but in addition these elements can be used for signal routing and EM-shielding of the cooled volumes and/or the signal routes.

It is evident from the above that the invention is not limited to the embodiments described in this text but can be implemented in many other different embodiments within the scope of the independent claims.

What is claimed is:

1. A thermalization arrangement at cryogenic temperatures, wherein the arrangement comprises:

a dielectric substrate layer on which substrate a device/s or component/s are positionable, and a heat sink component attached on another side of the substrate, the arrangement further comprising:

a conductive layer between the substrate layer and the heat sink component, a joint between the substrate layer and the conductive layer having minimal phonon thermal boundary resistance, wherein the minimal phonon thermal boundary resistance is defined to be below 10 K4/(W/cm2)/T3, and in which energy of conductive layer phonons are arranged to be absorbed by electrons, and another joint between the conductive layer and the heat sink component being electrically conductive, wherein the substrate layer has acoustic properties and the conductive layer has acoustic properties, and wherein some or all of the acoustic properties of the substrate layer and the conductive layer are such that phonons that passed through the joint between the substrate layer and the conductive layer are absorbed by the conductive layer.

2. The thermalization arrangement according to claim 1, wherein the substrate layer and the conductive layer have a high acoustic match, wherein the high acoustic match is defined by phonons transferring through the joint between the substrate layer and the conductive layer without back reflection.

3. The thermalization arrangement according to claim 1, wherein the substrate layer is a silicon-based material.

4. The thermalization arrangement according to claim 1, wherein the attachment between the heat sink component and the conductive layer comprises an electrically conductive adhesive.

5. The thermalization arrangement according to claim 4, wherein the attachment between the heat sink component and the conductive layer further comprises a metal layer between the conductive layer and the electrically conductive adhesive.

6. The thermalization arrangement according to claim 1, wherein the heat sink component is a metal layer or a solid-state cooler.

7. The thermalization arrangement according to claim 1, wherein the conductive layer comprises several galvanically isolated conductive areas.

8. The thermalization arrangement according to claim 7, wherein a solid-state cooler is used to cool the conductive layer.

9. The thermalization arrangement according to claim 8, wherein the solid-state cooler comprises of one or more daisy chains of two or more of solid-state coolers that each are electrically current biased in a way that an average voltage drop over each cooler provides optimal total cooling for the complete cooler assembly, the different coolers in the cooler chain are used to cool different galvanically isolated conductive areas of the conductive layer.

10. The thermalization arrangement according to claim 1, wherein the substrate layer comprises a micrometer-scale conductor projection in the dielectric substrate forming galvanically isolated electron-phonon thermalization point below 5K to a node of said device or component.

11. The thermalization arrangement according to claim 10, wherein the arrangement further comprises micrometer-scale conductor projections (8B) in the dielectric substrate having altogether 2-10 micrometer-scale conductor projections, which form together said galvanically isolated thermalization point.

12. The thermalization arrangement according to claim 10 wherein the micrometer-scale conductor projection has a width within range 1-100 μm.

13. The thermalization arrangement according to claim 10, wherein the micrometer-scale conductor projection has a length, which has at least 5:1 ratio to the width of the micrometer-scale conductor projection.

14. The thermalization arrangement according to claim 10, wherein the micrometer-scale conductor projection is a spike or a rod.

15. The thermalization arrangement according to claim 10, wherein the micrometer-scale conductor projection is made of conducting material that is non-superconducting at working temperature below 5 K.

16. The thermalization arrangement according to claim 1, wherein multiple thermalisation elements are arranged in a series configuration in a way that an active cooling layer of the heat sink component is connecting to an element layer that has micro-meter-scale conductor projections, or connecting to a further conductive layer, the element layer or the further conductive layer being connected to another conductive layer, which in turn is connected to another active cooling layer.

17. The thermalization arrangement according to claim 16, wherein the arrangement comprises a thin dielectric layer between the further conductive layer and the other conductive layer.

* * * * *